United States Patent
Pan et al.

(10) Patent No.: US 9,356,162 B2
(45) Date of Patent: May 31, 2016

(54) HIGH EFFICIENCY GROUP III-V COMPOUND SEMICONDUCTOR SOLAR CELL WITH OXIDIZED WINDOW LAYER

(75) Inventors: Noren Pan, Wilmette, IL (US); Christopher Youtsey, Libertyville, IL (US); David S. McCallum, West Chicago, IL (US); Victor C. Elarde, Evanston, IL (US); John M. Dallesasse, Niles, IL (US)

(73) Assignee: MicroLink Devices, Inc., Niles, IL (US)

( * ) Notice: Subject to any disclaimer, the term of this patent is extended or adjusted under 35 U.S.C. 154(b) by 313 days.

(21) Appl. No.: 12/695,671

(22) Filed: Jan. 28, 2010

(65) Prior Publication Data

US 2010/0186822 A1 Jul. 29, 2010

Related U.S. Application Data

(60) Provisional application No. 61/147,929, filed on Jan. 28, 2009.

(51) Int. Cl.
  *H01L 31/00* (2006.01)
  *H01L 31/0216* (2014.01)
  *H01L 31/18* (2006.01)
  *H01L 31/0687* (2012.01)
  *H01L 31/0735* (2012.01)

(52) U.S. Cl.
  CPC ...... *H01L 31/02168* (2013.01); *H01L 31/0687* (2013.01); *H01L 31/0735* (2013.01); *H01L 31/1868* (2013.01); *Y02E 10/544* (2013.01); *Y02P 70/521* (2015.11)

(58) Field of Classification Search
  CPC .............. H01L 31/00; H01L 31/02168; H01L 31/0687; H01L 31/0735
  See application file for complete search history.

(56) References Cited

U.S. PATENT DOCUMENTS

| 4,156,310 A | 5/1979 | Kamath |
| 4,575,577 A | 3/1986 | Fraas |
| 5,330,585 A | 7/1994 | Chang et al. |
| 5,373,522 A | 12/1994 | Holonyak, Jr. et al. |
| 2004/0200523 A1 | 10/2004 | King et al. |

FOREIGN PATENT DOCUMENTS

| JP | 56-18474 | 2/1981 |
| JP | 6-503919 | 4/1994 |

(Continued)

OTHER PUBLICATIONS

International Search Report and Written Opinion for Application No. PCT/US2010/022385, dated Mar. 23, 2010.

(Continued)

*Primary Examiner* — Shannon Gardner
(74) *Attorney, Agent, or Firm* — Nelson Mullins Riley & Scarborough LLP; Anthony A. Laurentano

(57) ABSTRACT

The present application utilizes an oxidation process to fabricating a Group III-V compound semiconductor solar cell device. By the oxidation process, a window layer disposed on a cell unit is oxidized to enhance the efficiency of the solar cell device. The oxidized window has an increased band gap to minimize the surface recombination of electrons and holes. The oxidized window also improves transparency at the wavelengths that were absorbed in the conventional window layer.

20 Claims, 9 Drawing Sheets

(56) References Cited

FOREIGN PATENT DOCUMENTS

| JP | 2001-237500 |      | 8/2001  |
|----|-------------|------|---------|
| JP | 2004-296658 |      | 10/2004 |
| JP | 2007-504659 |      | 3/2007  |
| JP | 2007-335753 | A2   | 12/2007 |
| WO | 2009/044171 | A2   | 4/2009  |

OTHER PUBLICATIONS

Japanese Office Action for Application No. 2011-548289, 5 pages, dated Mar. 19, 2013.
Japanese Office Action for Application No. 2011-548289, 7 pages, dated Sep. 3, 2013.
Algora Del Valle, Carlos et al., "Performance of Antireflecting Coating-AlGaAs Window Layer Coupling for Terrestrial Concentrator GaAs Solar Cells," IEEE Transactions on Electron Devices, vol. 44(9):1499-1506 (1997).
Cao, Y. et al., "Electrical properties of InAlP native oxides for metal-oxide-semiconductor device applications," Applied Physics Letters, vol. 86:062105-1-062105-3 (2005).
Islam, M.R. et al., "Effects of thermally grown native oxides on the luminescence properties of compound semiconductors," Appl. Phys. Lett, vol. 69(7):946-948 (1996).
Islam, M.R. et al., "Luminescence characteristics InAlP—InGaP heterostructures having native-oxide windows," Journal of Crystal Growth, vol. 170:413-417 (1997).
Sanfacon, Michael M. et al., "Analysis of AlGaAs/GaAs Solar Cell Structures by Optical Reflectance Spectroscopy," IEEE Transactions on Electron Devices, vol. 37(2):450-454 (1990).
Van Riesen, S. et al., "Degradation Study of III-V Solar Cells for Concentrator Applications," Progress in Photovoltaics: Research and Applications, vol. 13:369-380 (2005).
Supplementary European Search Report for Application No. 10736391.3, 9 pages, dated Sep. 27, 2013.
Australian Office Action for Application No. 2010208225, 3 pages, dated Feb. 28, 2014.
Canadian Office Action for Application No. 2,750,656, 3 pages, dated Mar. 4, 2014.
Canadian Office Action for Application No. 2,750,656, 3 pages, dated Dec. 27, 2012.

HIGH EFFICIENCY GROUP III-V COMPOUND SEMICONDUCTOR SOLAR CELL WITH OXIDIZED WINDOW LAYER

RELATED APPLICATION

This application claims priority to Provisional Application No. 61/147,929 filed on Jan. 28, 2009, which is herein incorporated by reference in its entirety.

This invention was made with Government support under FA9453-09-C-0372 awarded by Air Force Research Laboratory. The Government has certain rights in the invention.

BACKGROUND

The present application concerns photovoltaic devices, such as solar cell devices. More specifically, the present application concerns Group III-V compound semiconductor based photovoltaic devices employing a window layer.

A photovoltaic device converts light energy into electricity. Although the term "solar cell device" may sometimes be used to refer to a device that captures energy from sunlight, the terms "solar cell device" and "photovoltaic device" are interchangeably used in the present application regardless of the light source.

FIG. 1 is a cross-sectional view of a conventional multiple junction solar cell device 100. The multiple junction solar cell device 100 may include a substrate 101, a bottom cell unit 103, a middle cell unit 105, and a top cell unit 107. The multiple junction solar cell device 100 can be positioned to receive light from the front or top (illuminated) side of the device. The light typically include a plurality of wavelengths, and the cell units 103, 105 and 107 are typically designed to absorb different wavelengths of light. For example, the first range of wavelengths 111 may be absorbed in the bottom cell unit 103, the second range of wavelengths 113 may be absorbed in the middle cell unit 105, and the third range of wavelengths 115 may be absorbed in the top cell unit 107.

The multiple junction solar cell device 100 may also include a window layer 109 to improve the overall efficiency of the solar cell device 100. In the conventional multiple junction solar cell device 100, InAlP is widely used as a standard window layer. The window layer 109 is generally provided to prevent the surface recombination of photo-generated carriers. With the conventional window layer 109, the fourth wavelength 117, such as the far blue end or ultraviolet region of the solar spectrum, are absorbed in the window layer 109 so that the fourth range of wavelengths 117 are not transmitted to any of the cell units 103, 105 and 107 of the device 100. Therefore, the efficiency of the conventional device 100 decreases due to the window layer 109. Furthermore, one important mechanism for loss in the solar cell device is the recombination of photo-generated carriers, such as holes and electrons, at the top surface of the solar cell device due to the high density of surface states. The conventional window layer has a band gap of around 2.0 eV. A wider band gap would enhance the efficiency of the solar cell device 100 by reducing the recombination of the photo-generated carriers. However, it is difficult to grow materials with a band gap larger than 2.0 eV that are lattice matched to GaAs substrates in the conventional solar cell device 100.

Accordingly, a new solar cell structure is also needed with a window layer that minimizes surface recombination.

SUMMARY

The present application provides a new solar cell device structure with a window layer that transmits more wavelengths and passivates the surface of the solar cell device. The present application teaches different structures for Group III-V compound semiconductor solar cell devices. The solar cell structure of the present invention includes oxidized window layers provided on the top or front (illuminated) surface of the solar cell devices. The oxidized window layers are provided using a thermal oxidation process, such as a wet oxidation technique. The oxidation process provides a wider band gap for the window layer so that a larger barrier prevents photo-generated carriers, such as electrons and holes, from reaching the surface of the devices. Therefore, the oxidized window layer minimizes surface recombination of the photo-generated carriers at the top surface of the solar cell devices. The oxidation process may also help reduce surface recombination by passivating surface states of the solar cell devices.

Furthermore, the wider band gap of the oxidized window layer improves transmission of higher energy photons through the window layer. The oxidized window layer is optically transparent in the ultraviolet region or the far blue end of the solar spectrum so that the oxidized window layer provides improved transmission of higher energy photons to the cell units of the solar cell device.

In accordance with one embodiment, a method is provided for fabrication of a Group III-V compound semiconductor solar cell. The method involves forming at least a cell unit from a Group III-V compound semiconductor material. The cell unit is configured to absorb predetermined wavelengths of a solar spectrum. A window layer is formed on the cell unit to reduce recombination of photo-generated carriers at a top surface of the solar cell device. The window layer is oxidized to convert the window layer to an oxidized window layer.

In the above embodiment, the window layer may be oxidized using a wet oxidation process. The oxidized window layer may have a larger band gap than the window layer. The band gap of the oxidized window layer may be about 4.0 eV. The window layer may be an Al-containing Group III-V compound semiconductor material. For example, the window layer may be an InAlP window layer or an AlGaAs window layer. The oxidized window layer may transmit a second range of wavelengths of the solar spectrum to the cell unit to increase a photoluminescence (PL) intensity of the cell unit, the second range of wavelengths being absorbed in the window layer. The second range of wavelengths may be wavelengths of a far blue end of the solar spectrum. The cell unit may be formed from any of Gallium Arsenide (GaAs), Gallium Iridium Phosphide ($Ga_{1-x}In_xP$), Gallium Indium Arsenide ($Ga_{1-x}In_xAs$), Indium Phosphide (InP) and Gallium Indium Arsenide Phosphide ($Ga_{1-x}In_xAs_{1-y}P_y$), and Aluminum Gallium Indium Phosphide (($Al_xGa_{1-x})_{1-y}In_yP$). The solar cell device may be a single junction device or a multijunction device having a plurality of cell units, each cell unit being configured to absorb a different range of wavelengths in the solar spectrum.

The method of the above embodiment may include the step of providing a substrate on which the cell is formed, wherein the substrate is formed of at least one of Gallium Arsenide (GaAs) and Indium Phosphide (InP). The step of oxidizing may include the steps of providing a cap layer on the window layer to enhance an electrical contact with a metal conductive material, etching the cap layer, and oxidizing an exposed portion of the window layer, the exposed portion corresponding to an etched portion of the cap layer. The method of the above embodiment may include the steps of providing the metal conductive material on the cap layer, and applying an antireflection coating to the oxidized window layer. The method of the above embodiment may include the step of providing a backside contact on a bottom surface of the substrate.

In another embodiment, a solar cell device is provided to include at least one cell unit formed from a Group III-V compound semiconductor material. The cell unit is configured to absorb predetermined wavelengths of a solar spectrum. The solar cell device also includes an oxidized window layer disposed on the cell unit to prevent recombination of photo-generated carriers at a top surface of the solar cell device.

In the above embodiment, the band gap of the oxidized window layer may be about 4.0 eV. The oxidized window layer may include an Al-containing Group III-V compound semiconductor material. The window layer may include an InAlP material or an AlGaAs material. The cell unit may be formed from any of Gallium Arsenide (GaAs), Gallium Indium Phosphide ($Ga_{1-x}In_xP$), Gallium Iridium Arsenide ($Ga_{1-x}In_xAs$), Indium Phosphide (InP) and Gallium Indium Arsenide Phosphide ($Ga_{1-x}In_xAs_{1-y}P_y$), and Aluminum Gallium Indium Phosphide ($(Al_xGa_{1-x})_{1-y}In_yP$). The solar cell device of the above embodiment may include a plurality of cell units, each cell unit being configured to absorb different wavelengths of the solar spectrum. The solar cell device of the above embodiment may include a substrate on which the cell unit is formed, wherein the substrate is formed of at least one of Gallium Arsenide (GaAs) and Indium Phosphide (InP). The solar cell device of the above embodiment may include a cap layer disposed on the window layer to enhance an electrical contact with a metal conductive material disposed on the cap layer. The solar cell device of the above embodiment may include a backside contact disposed on a bottom surface of the substrate.

BRIEF DESCRIPTION OF THE FIGURES

These and other characteristics of the present application will be more fully understood by reference to the following detailed description in conjunction with the attached drawings, in which.

DESCRIPTION

The embodiments of the present application provide Group III-V compound semiconductor solar cell devices and methodologies for fabricating such solar cell devices. The Group III-V compound semiconductor solar cell devices as taught herein include an oxidized window layer formed on the top or front surface of the devices using a thermal oxidation process, such as a wet oxidation technique. The oxidation provides a wider band gap for the window layer so that the oxidized window layer improves transparency at the far blue end of the solar spectrum. Therefore, the oxidized window layer provides improved transmission of higher energy photons to the cell units of the solar cell device.

Furthermore, the wider band gap of the oxidized window layer prevents electrons and holes from reaching the surface of the solar cell devices. Therefore, the oxidized window layer minimizes surface recombination of the holes and electrons at the top surface of the solar cell devices and passivates the surface states of the solar cell device.

Figure 1:
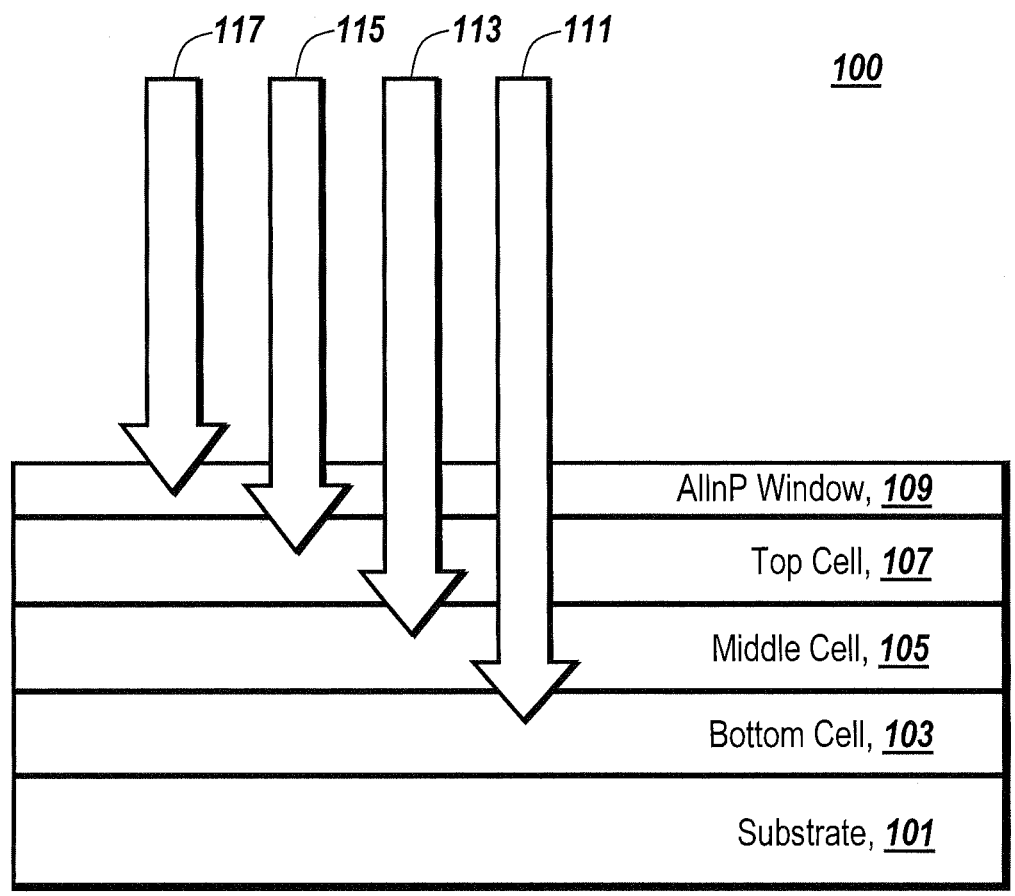
FIG. 1 is a cross-sectional view of a conventional Group III-V compound semiconductor solar cell device with a window layer.
Figure 2A:
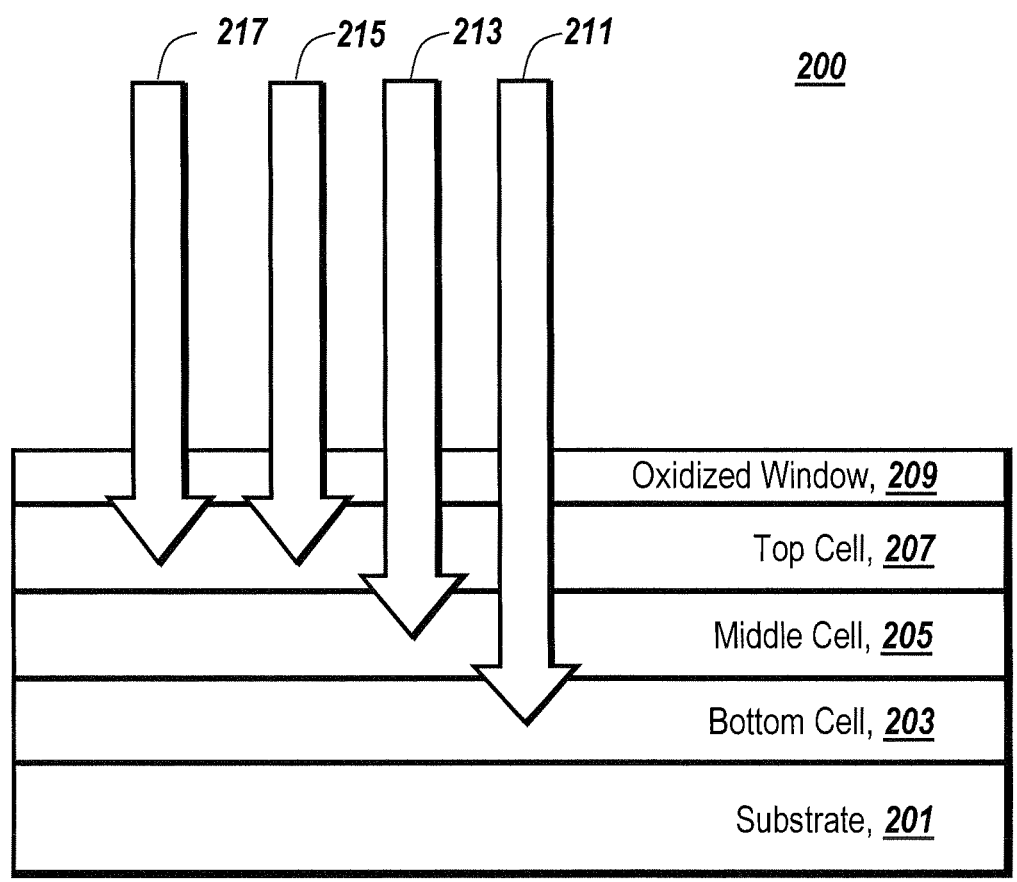
FIG. 2A is a cross-sectional view of a Group III-V compound semiconductor solar cell device with an oxidized window layer according to the teachings of the present invention.

FIG. 2A is a schematic cross-sectional diagram of an exemplary multiple junction solar cell device 200 suitable for use with the oxidized window layer of the present invention. The multiple junction solar cell device 200 may include a substrate 201, a first or bottom cell unit 203, a second or middle cell unit 205, and a third or top cell unit 207. As used herein, the term "cell unit" refers to a layer or region of the solar cell device having a certain band gap energy characteristic, which uses a certain portion of the solar spectrum to generate electricity. As used herein, each cell unit in a multiple junction solar cell device has a different band gap energy characteristic.

Those of ordinary skill in the art will appreciate that the multiple junction solar cell device 200 is exemplary and that any number of junctions can be employed in the illustrated solar cell device. For example, the illustrated solar cell device can include a single-junction or more, such as two or three junctions. Those of ordinary skill will also readily understand the various layers that comprise each junction of the solar cell device 200.

The substrate 201 serves as a base providing a suitable lattice structure onto which the Group III-V compound semiconductor solar cell device 200 is formed. The fabrication methodology of the Group III-V compound semiconductor solar cell device 200 as taught herein involves growing epitaxial layers on a provided substrate, as is known to those of ordinary skill in the art. The substrate 201 may be formed from Germanium (Ge), Gallium Arsenide (GaAs), Indium Phosphide (InP), Gallium Phosphide (GaP), Gallium Antimonide (GaSb) or any other suitable Group III-V compound semiconductor material or combination of materials.

Each cell unit 203, 205 and 207 of the illustrated solar cell device 200 can be formed of one or more Group III-V compound semiconductor materials, such as Gallium Arsenide (GaAs), Gallium Iridium Phosphide (GaInP), Gallium Iridium Arsenide (GaInAs), Gallium Indium Arsenide Phosphide (GaInAsP), or any other suitable Group III-V compound semiconductor material or combination of materials. Each cell unit may contain an emitter region, a base region, and a junction between the emitter region and the base region. The emitter region may include an emitter layer formed of an n-type Group III-V compound semiconductor material and the base region may include a base layer formed of a p-type Group III-V compound semiconductor material. The emitter layer and the base layer may be formed of a p-type Group III-V compound semiconductor material and an n-type Group III-V compound semiconductor material, respectively, in other embodiments.

Those of ordinary skill will readily recognize that each cell unit can have a certain band gap energy characteristic, which uses a certain portion of the solar spectrum to generate electricity. The cell units in the multiple junction solar cell device 200 may be formed from different semiconductor materials comprised of varying compositions of the elemental materials Ga, In, Al, As, P, Sb, Ge, and Si so that the multiple cell units may have different band-gaps to absorb different wavelengths of the solar spectrum. For example, the first cell unit 203, the second cell unit 205 and the third cell unit 207 may be formed of InGaAs, GaAs and GaInP, respectively. Therefore, the first cell unit 203, the second cell unit 205 and the third cell unit 207 may absorb different wavelengths of the solar spectrum.

An oxidized window layer 209 is provided on the top surface of the third or top cell unit 207. The oxidized window layer 209 may include an Al-containing Group III-V compound semiconductor oxide. According to one embodiment, an Al-containing Group III-V compound semiconductor material, such as AlGaAs, AlAs, InAlAs or InAlP, is deposited on the top surface of the third or top cell unit 207 and the Al-containing Group III-V compound semiconductor material is oxidized using a thermal oxidation process, such as wet oxidation, to form the oxidized window layer 209. The present inventors have realized that once oxidized, the oxidized window layer has a longer or expanded band gap of around 4.0 eV. This wider band gap prevents electrons and holes from being recombined at the top surface of the solar cell device. The wider band gap also improves the optical transparency of the window layer at the far blue end or ultraviolet region of the solar spectrum, thereby allowing these wavelengths to pass therethrough. In prior devices, these wavelengths are typically absorbed by the window layer, which is unoxidized. The oxidation of the window layer will be described below with reference to FIG. 2B.

In operation, the cell units 203, 205 and 207 receive light from the top or front side of the solar cell device 200. The first range of wavelengths 211 of the solar spectrum, such as a red light region of the solar spectrum, may be absorbed in the bottom cell unit 203. The second range of wavelengths 213, such as a yellow light region of the solar spectrum, may be absorbed in the middle cell unit 205. The third range of wavelengths 215, such as the green light region of the solar spectrum, may be absorbed in the top cell unit 207. Furthermore, the fourth range of wavelengths 217, such as the far blue end or ultraviolet region of the solar spectrum, are now transmitted to the top cell unit 207 so that the fourth range of wavelengths 217 are absorbed in the top or other cell units of the device 200. Consequently, the oxidized window layer 209 improves the efficiency of the solar cell device 200.

Figure 2B:
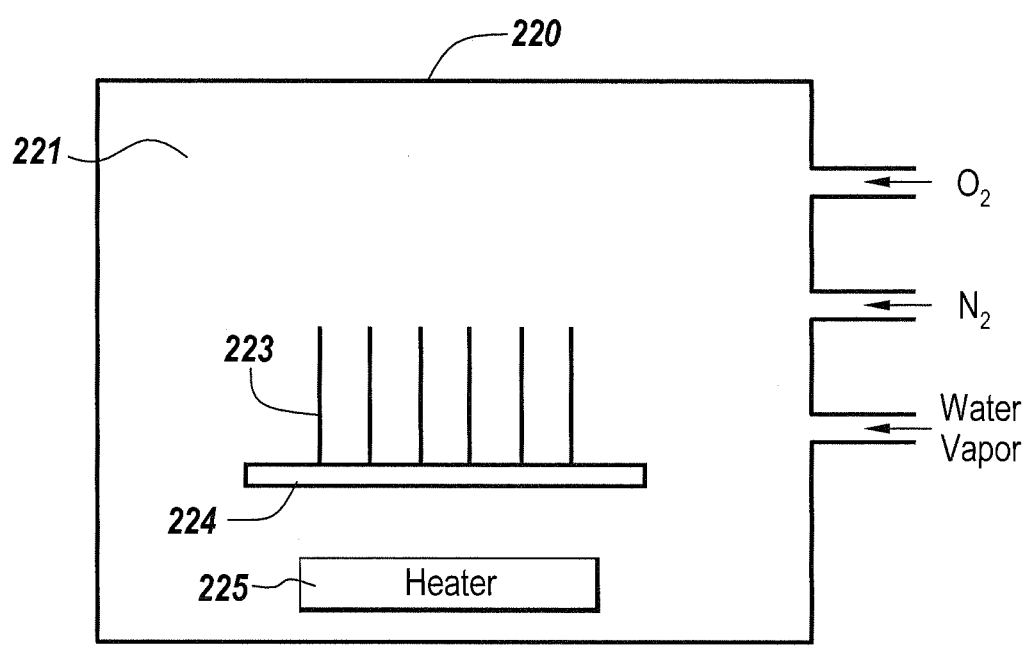
FIG. 2B is a simplified schematic diagram of a furnace where a window layer is oxidized by a wet oxidation process according to the teachings of the present invention.

FIG. 2B shows a simplified furnace 220 in which a window layer is oxidized in accordance with the teachings of the present application. Various system components such as flow regulators, piping structures and controllers are omitted for the sake of simplicity. The furnace 220 may be an oxidation furnace that can diffuse oxidant agents or gases to the wafers loaded in the furnace. For example, heat treatment furnaces from Lingberg/MPH can be used for oxidizing the window layer in an embodiment of the present application.

The furnace 220 may include a process chamber 221 where the wafer 223 is loaded for oxidation. The process chamber 221 can be configured to accept a single wafer. In another embodiment, the process chamber 221 may be configured to accept a plurality of wafers 223 at the same time. The furnace 220 may also include a mechanism 224 for holding the wafers 223 within the process chamber 221. The wafers 223 are held within the process chamber 221 in a vertical direction. In another embodiment, the wafers 223 may be held within the process chamber 221 in a horizontal direction.

The furnace 220 may include one or more ports for receiving an oxidant agent or gas, such as oxygen gas and water vapor such as steam. The furnace 220 may also include a port for receiving an inert gas, such as nitrogen gas. The ratio of oxygen gas, steam and the nitrogen gas may be optimized depending on the type of the material to be oxidized and the thickness of the oxide to be formed.

The furnace 220 may include a heating source 225 for heating the process chamber 221 to a target temperature. The oxidation may be performed using a wet oxidation process where the oxidation reactions occur at a temperature above the normal boiling point of water (100° C.) so that water vapors or steam can be used as oxidant agents. According to one embodiment, the temperature of the process chamber 221 can be in the range of from about 300° C. to about 600° C., and is preferably in the range of about 350° C. to about 550° C. Those of ordinary skill in the art will appreciate that the temperature of the process chamber 221 may be adjusted depending on the type of the material to be oxidized and the thickness of the oxide to be formed.

It is preferred that the pressure of the process chamber 221 is set to atmospheric pressure. It is also preferred that the exposure time of the wafers 223 in the process chamber 221 is in the range of about 20 minutes to about 6.0 hours. A more preferred time period is about 1.0 hour to about 3.0 hours. Those of ordinary skill in the art will appreciate that the exposure time in the process chamber may be determined depending on the type of the material to be oxidized and the thickness of the oxide to be formed.

According to one practice, the entire portion or thickness of the window layer can be oxidized. Alternatively, only a portion of the window layer is oxidized. For example, a top half thickness of the window layer can be oxidized. By the wet oxidation process, the thickness of the oxidized window layer is maintained substantially the same as the thickness of the window layer prior to the oxidation. In a different embodiment, the thickness of the oxidized window layer may be slightly larger than the thickness of the window layer prior to the oxidation.

Examples of wet oxidation methodologies are described in detail in U.S. Pat. Nos. 5,262,360, 5,373,522, 5,567,980, and 5,696,023, the contents of which are herein incorporated by reference.

The present inventors have realized that the wet oxidation process converts the window layer of the solar cell device to a very stable oxide material having highly desirable characteristics. The oxides of the window layer provide low oxide-semiconductor interface state densities and an unpinned Fermi level at the oxide-semiconductor interface. Therefore, the oxide passivates the window layer of the solar cell device. Those of ordinary skill in the art will appreciate that the wet oxidation process employed herein is exemplary and the window layer may be oxidized using other thermal oxidation processes, such as a dry oxidation process.

Figure 3:
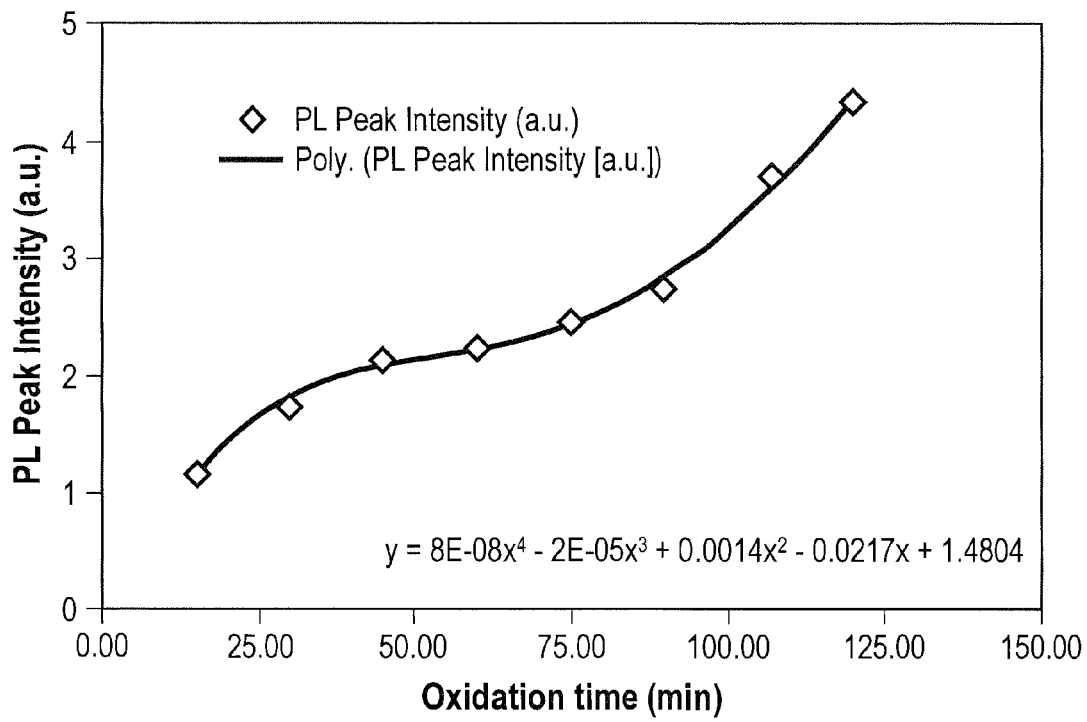
FIG. 3 is a graph showing the effect of the oxidized window on the photoluminescence of the solar cell device of FIG. 2A.

FIG. 3 is a graph showing the effect of the oxidized window layer on the photoluminescence (PL) of a single junction solar cell device. The single junction solar cell device may include an InGaP cell unit and an InAlP window layer deposited on the InGaP cell unit. The graph shows that the PL intensity of the InGaP cell unit increases with increasing oxidation time. The increase of the PL intensity suggests that surface recombination of electrons and holes is substantially reduced.

Figure 4:
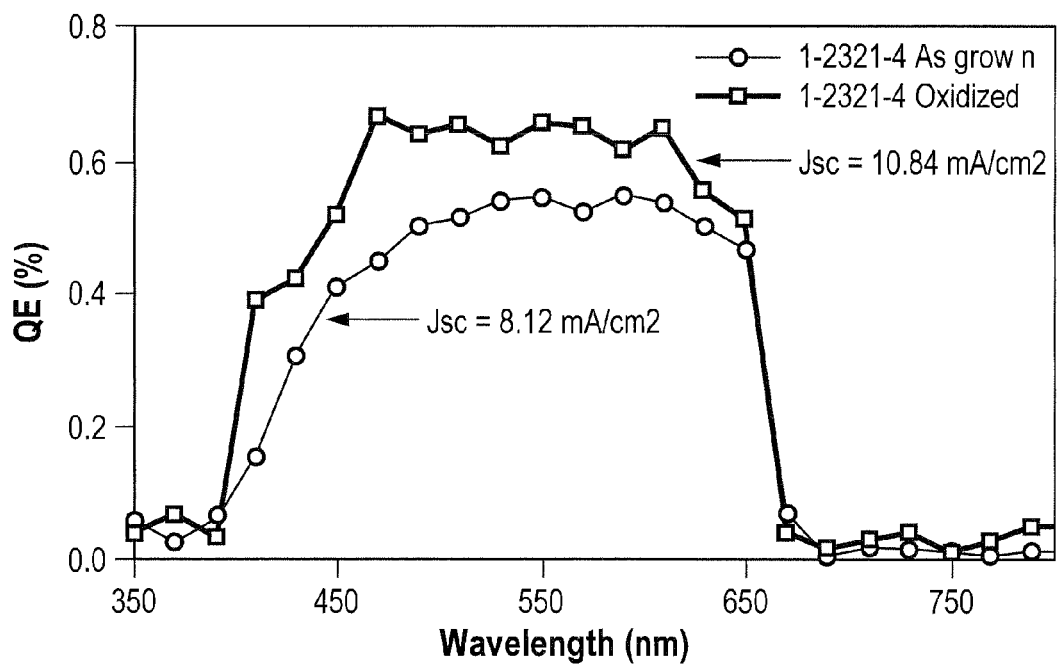
FIG. 4 is a graph showing the external quantum efficiency of a single junction solar cell device with an oxidized window layer and with an unoxidized window layer.

FIG. 4 is a graph showing the external quantum efficiency (EQE) of a single junction solar cell device. The single junction solar cell device includes an InGaP cell unit and an InAlP window layer deposited on the InGaP cell unit. The EQE is defined as the current obtained outside the device per incoming photon. Therefore, EQE depends on the absorbtion of light and the collection of charges. Once a photon has been absorbed and has generated an electron-hole pair, these charges must be separated and collected at the junction. The recombination of the charges decreases the EQE.

The upper graph in FIG. 4 shows the EQE of the solar cell device with an oxidized window layer. The lower graph shows the EQE of the solar cell device with an unoxidized window layer. As shown by the graphs, the EQE of the single junction solar cell with the oxidized window layer is higher than the EQE of the single junction solar cell with the unoxidized window layer in the wavelength rage of 370 nm-650 nm. The graphs indicate that the oxidized window layer improves the surface recombination, especially in the far blue end or ultraviolet region of the solar spectrum.

Figure 5:
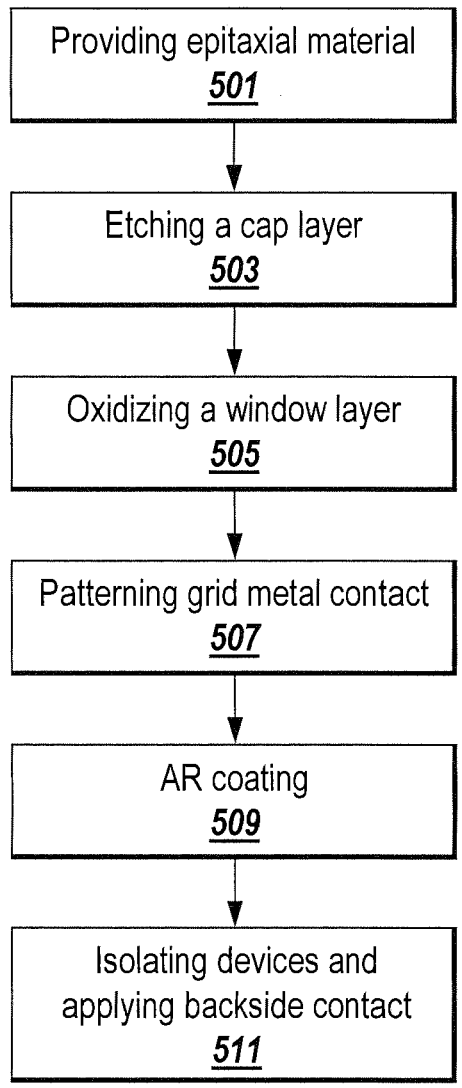
FIG. 5 is a schematic flow chart diagram of an exemplary method for fabricating the solar cell devices in accordance with the teachings of the present application.

FIG. 5 is a schematic flow chart diagram of an exemplary method for fabricating solar cell devices in accordance with the teachings of the present application. In accordance with an embodiment of the present application, a wafer including a single or multiple cell units formed on a substrate may be provided as a starting material (step 501). Those skilled in the art will appreciate that any number of the cell units or junctions can be employed in the solar cell device of the present application. An unoxidized window layer is provided on the top surface of the single or multiple cell units. A cap layer may be deposited over the unoxidized window layer. The cap layer may be provided to enhance the electrical contact with a metal conductive material, such as the front or top side grid metal contact of the solar cell devices.

The cap layer may be etched according to the pattern of the grid metal contact (step 503). After etching of the cap layer, the wafer is loaded in the furnace depicted in FIG. 2B. The exposed portion of the window layer, which corresponds to the removed portion of the cap layer, is oxidized using the thermal oxidation process (step 505). After oxidation, the wafer is unloaded from the furnace and the grid metal contact is formed on the remaining cap layer (step 507). An antireflection coating (for example, a zinc sulfide/magnesium fluoride coating or other suitable antireflection coating) is formed on the surface of the oxidized window layer (step 509). An isolation etch is performed, and a backside metal contact is applied to the solar cell device (step 511).

Those of ordinary skill in the art will appreciate that the order of the above fabrication process may change in some embodiments of the present application. For example, the front or top side grid metal contact is applied before step 503 and a self-aligned etch may be used to remove the cap layer. The etched wafer is loaded in the furnace because the grid metal contact is stable under the high-temperature oxidation conditions.

In some embodiments, additional processing may be performed such as wafer probing, wafer bonding, testing of individual or groups of Group III-V compound semiconductor solar cells, slicing of the wafer to produce individual Group III-V compound semiconductor solar cells, packaging of the individual Group III-V compound semiconductor solar cells, formation of multiple junction Group III-V compound semiconductor solar cells and other like processes.

Figure 6A:
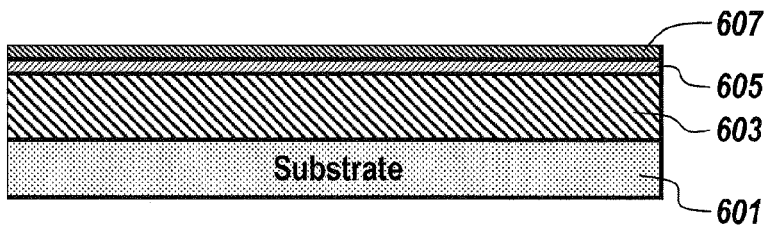
FIGS. 6A-6E show the intermediate state of the solar cell device fabrication according the method described in FIG. 5.

FIGS. 6A-6E shows the intermediate states of the solar cell device fabrication according the method described in FIG. 5. FIG. 6A shows a starting epitaxial material including a substrate 601, a single or multiple cell units 603, an unoxidized window layer 605 and a cap layer 607. Those skilled in the art will appreciate that any number of the cell units or junctions can be employed in the solar cell device of the present application. The unoxidized window layer may include an Al-containing Group III-V compound semiconductor material, such as AlGaAs, AlAs, InAlAs or InAlP. The cap layer may enhance the electrical contact with a front or top side grid metal contact of the solar cell device.

Figure 6B:
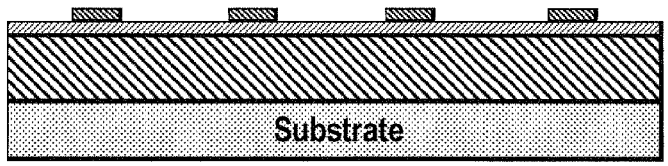
Figure 6C:
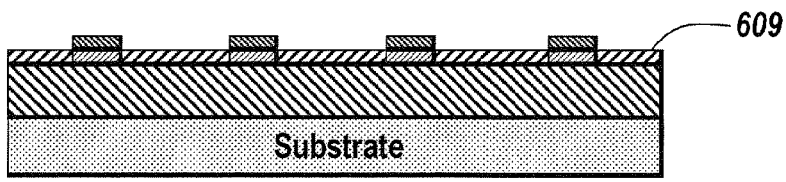
Figure 6D:
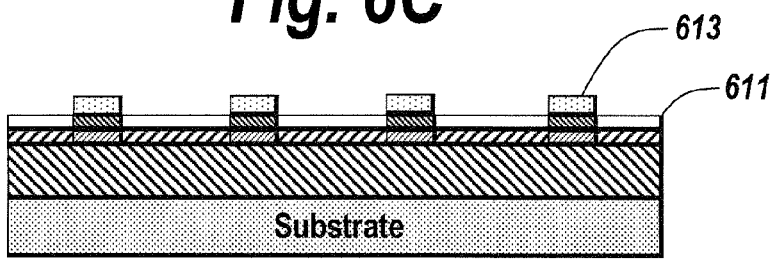
Figure 6E:
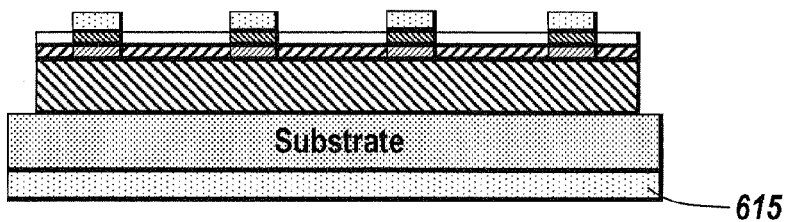

FIG. 6B shows a state where the cap layer 607 is etched according to the pattern of the grid metal contact 613. After etching of the cap layer, the wafer is loaded in the furnace depicted in FIG. 2B to oxidize the window layer 605. FIG. 6C shows a state where the exposed portion of the window layer 605, which corresponds to the removed portion of the cap layer, is oxidized to form an oxidized window layer 609. After oxidation, the wafer is unloaded from the furnace and the grid metal contact is formed on the remaining cap layer. FIG. 6D shows that the grid metal contact 613 is formed on the cap layer. FIG. 6D also shows that an antireflection coating 611 is formed on the surface of the oxidized window layer 609. FIG. 6E shows that an isolation etch is performed, and a backside metal contact 615 is applied to the solar cell device.

For experimental purposes, a solar cell structure is grown consisting of a standard InGaP/GaAs double junction solar cell device with a 2500 Å InAlP window layer. The top contact layer is patterned and etched and the wafer is cleaved into several pieces. Two pieces are oxidized via a high-temperature wet-oxidation process. For one of the two pieces, the window layer is completely oxidized. For the other piece, only the top half of the window layer is oxidized. A third piece is left unoxidized. All three of these pieces are then processed into solar cell devices and tested to measure photoluminescence (PL), current-voltage (IV) data and Internal quantum efficiency (IQE).

Figure 7:
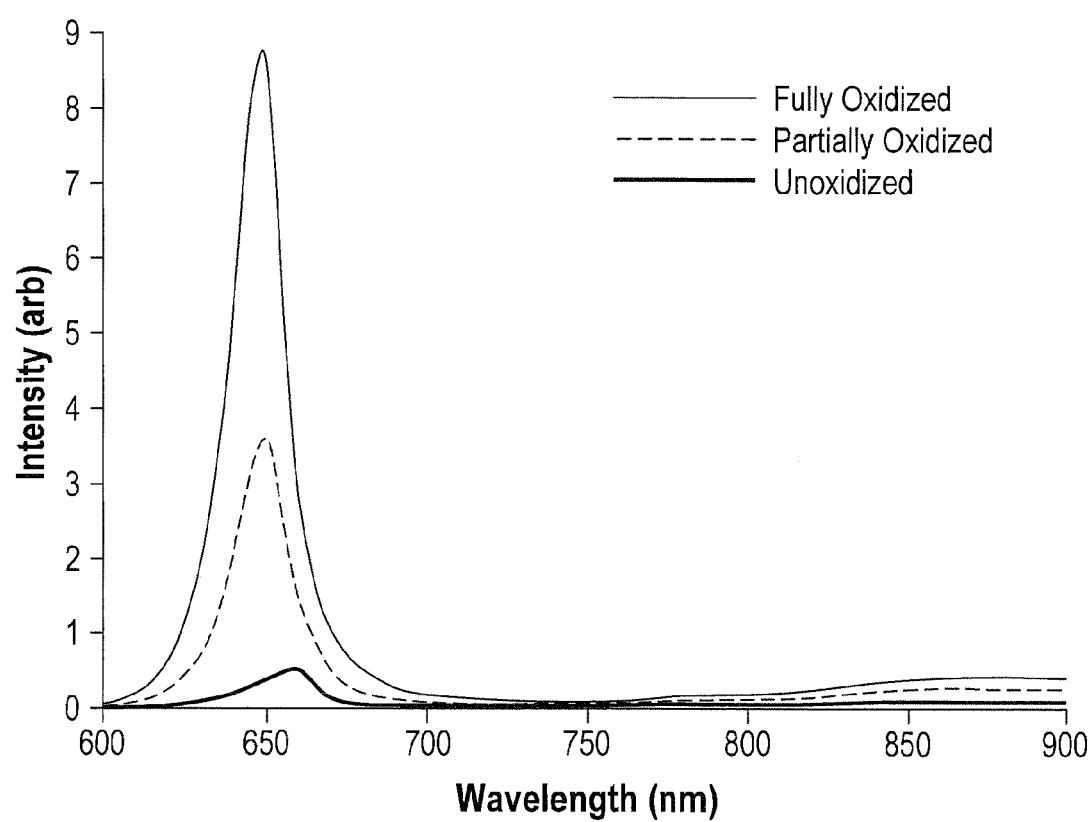
FIG. 7 shows the photoluminescence measurements of unoxidized, half oxidized, and fully oxidized dual-junction solar cell devices fabricated from the same epitaxial structure.

FIG. 7 shows the result of a test measuring the PL of the three samples. That is, the graph shows the PL of the top InGaP cell unit with the unoxidized, partially oxidized, and fully oxidized InAlP window layer. The PL of the top InGaP cell unit terminated with the oxidized window layer demonstrates much stronger than the PL of the top InGaP cell unit terminated with the unoxidized window layer. This test result indicates that the oxidized window layer reduces carrier losses via recombination and the oxide passivates the surface of the solar cell device. Additionally, the PL of the top InGaP cell unit terminated with oxidized window layer is slightly blue shifted from that of the top InGaP cell unit terminated with unoxidized window layer. This result indicates that the oxidized window layer reduces absorption of far blue end of the solar spectrum by the window layer.

Figure 8:
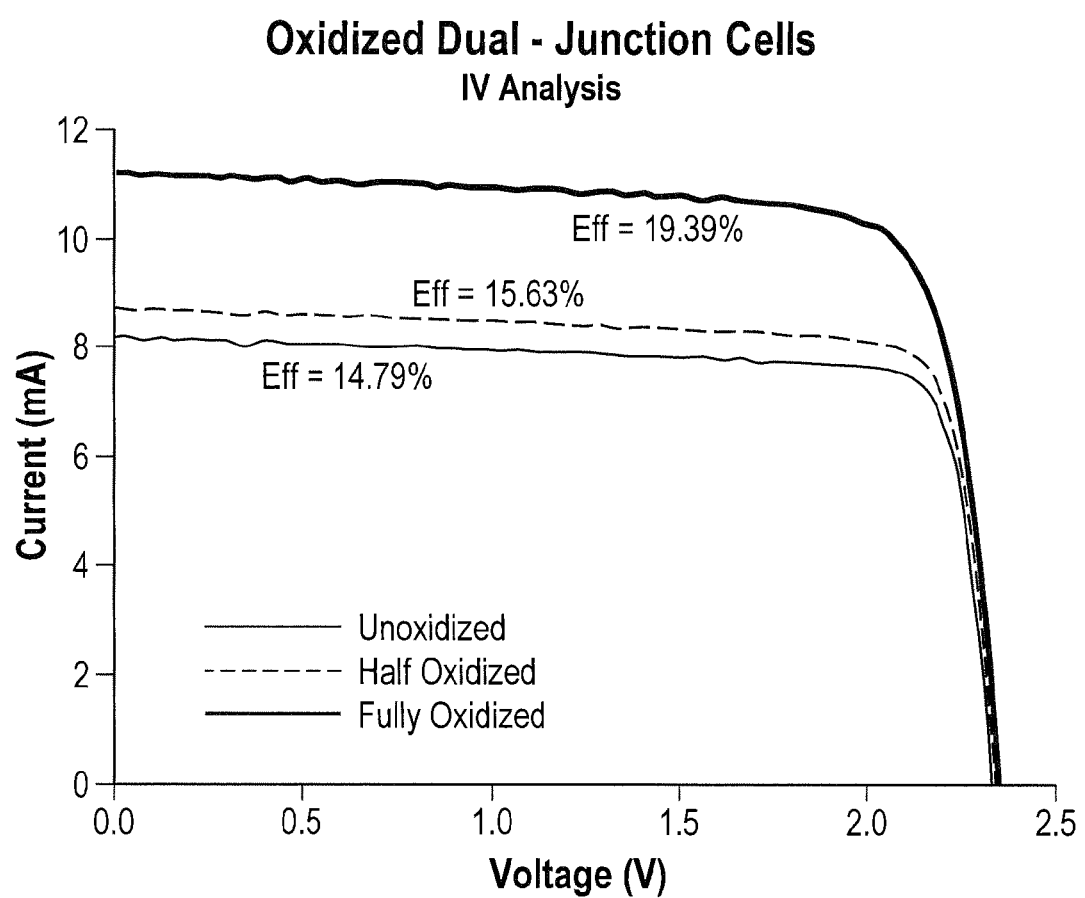
FIG. 8 shows current-voltage measurements of unoxidized, half oxidized, and fully oxidized dual-junction solar cell devices fabricated from the same epitaxial structure.

FIG. 8 shows the result of a test measuring the IV data of the unoxidized, half oxidized, and fully oxidized dual-junction solar cell devices. The measurement is performed under AM-1.5 illumination. A higher short-circuit current (Isc) is obtained for the oxidized dual-junction solar cell devices. This result indicates that the additional photons reach the top InGaP unit cell as a result of the increased window layer transparency.

Figure 9:
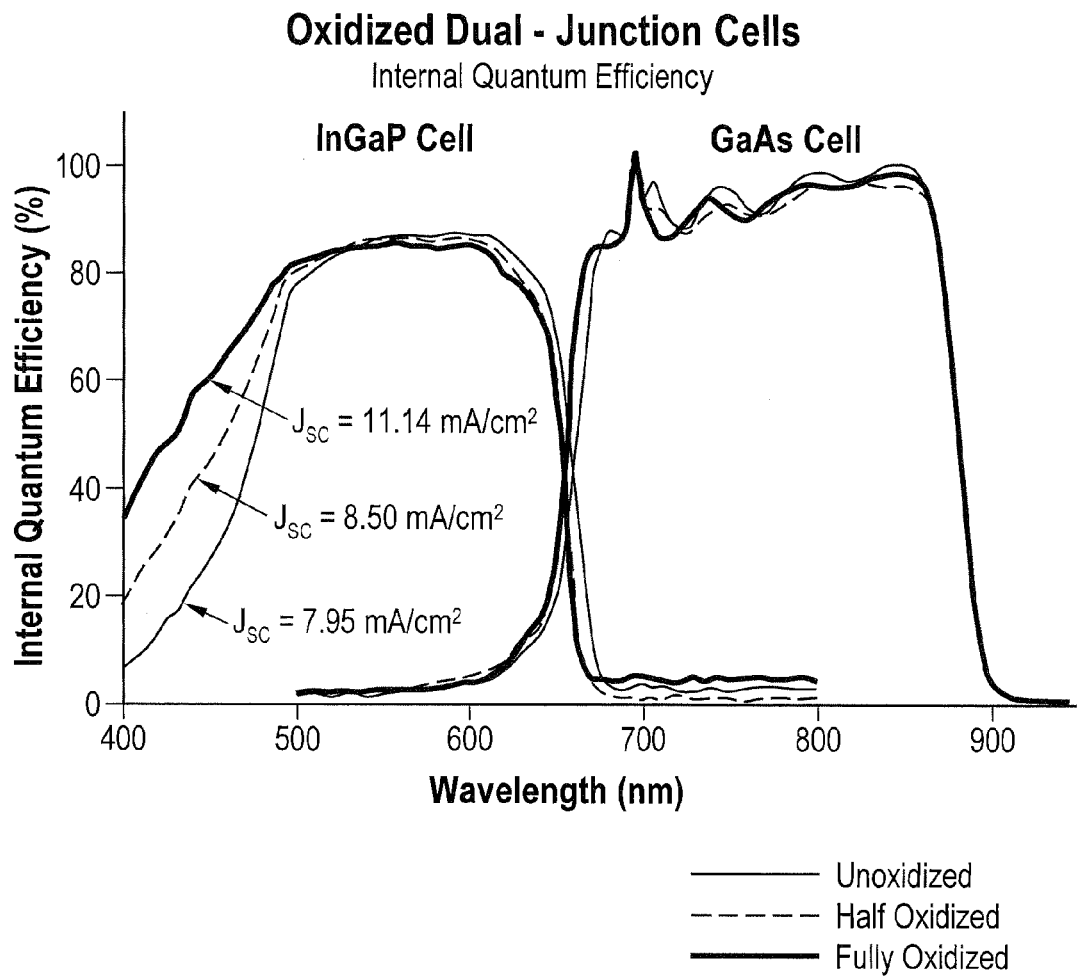
FIG. 9 shows the Internal Quantum Efficiency measurements of the unoxidized, half oxidized, and fully oxidized dual-junction solar cells fabricated from the same epitaxial structure.

FIG. 9 shows the IQE measurements of the unoxidized, half oxidized, and fully oxidized dual-junction solar cell devices. The IQE refers to the efficiency with which photons that are not reflected or transmitted out of the cell can generate collectable carriers. The IQE of the three dual-junction solar cell devices are similar, except at the far blue end of the spectrum. Additional efficiency is obtained for the oxidized samples since less photons are absorbed (and wasted) by the InAlP window layer. The oxidized cells have increased response at the far blue end of the spectrum due to the increased transparency of the InAlP window layer resulting from the oxidation process.

One of the advantages of the present application is that the efficiency of Group III-V compound semiconductor solar cell devices is significantly improved by employing oxidized window layers. The oxidized window layers have a wider band gap than unoxidized window layers so that the oxidized window layers can transmit more light to the cell units of the solar cell devices. The wider band gap of the oxidized window layer reduces the surface recombination of holes and electrons and hence improves the efficiency of the solar cell devices.

The above advantages outweigh the complexity of the process for fabricating a solar cell device with a window layer oxidized. For oxidation of the window layer, the wafer is loaded and unloaded from the furnace during the fabricating process of the solar cell device. Although the fabrication process becomes complex, the present application provides a wider band gap and improved optical transparency of the oxidized window layer at the far blue end or ultraviolet region of a solar spectrum.

Numerous modifications and alternative embodiments of the present application will be apparent to those skilled in the art in view of the foregoing description. Accordingly, this description is to be construed as illustrative only and is for the purpose of teaching those skilled in the art the best mode for carrying out the present application. Details of the structure may vary substantially without departing from the spirit of the present application, and exclusive use of all modifications that come within the scope of the appended claims is reserved. It is intended that the present application be limited only to the extent required by the appended claims and the applicable rules of law.

It is also to be understood that the following claims are to cover all generic and specific features of the invention described herein, and all statements of the scope of the invention that, as a matter of language, might be said to fall therebetween.

The invention claimed is:

1. A method for fabricating a Group III-V compound semiconductor solar cell device, the method comprising the steps of:
   forming at least one cell unit from a Gallium Indium Phosphide ($Ga_{1-x}In_xP$) compound semiconductor material, the cell unit being configured to absorb predetermined wavelengths of a solar spectrum;
   forming an unoxidized window layer on the cell unit to prevent recombination of photo-generated carriers at a top surface of the solar cell device, wherein the unoxidized window layer thickness is about 2500 Angstroms;
   providing a cap layer on the window layer to enhance an electrical contact with a metal conductive material;
   etching the cap layer to expose at least a portion of the window layer; and
   oxidizing the window layer to convert the window layer to an oxidized window layer, wherein the step of oxidizing includes the further steps of:
      once the cell unit is formed, subjecting the cell unit to a post-processing wet oxidation technique including placing the cell unit with the unoxidized window layer in a chamber of a furnace having a temperature in the range of 350° C. to 550° C. and a pressure of generally atmospheric pressure, and
      placing the cell unit in the chamber for a time in a range between about 1.0 hour and about 3.0 hours; and then
      oxidizing the exposed portion of the window layer using the wet oxidation technique after the device is formed, the exposed portion corresponding to an etched portion of the cap layer.

2. The method of claim 1, wherein the oxidized window layer has a larger band gap than the window layer.

3. The method of claim 1, wherein a band gap of the oxidized window layer is about 4.0 eV.

4. The method of claim 1, wherein the window layer is an Al-containing Group III-V compound semiconductor material.

5. The method of claim 1, wherein the window layer is an InAlP window layer or an AlGaAs window layer.

6. The method of claim 1, wherein the oxidized window transmits a second range of wavelengths of the solar spectrum to the cell unit to increase a photoluminescence (PL) intensity of the cell unit, the second range of wavelengths being absorbed in the window layer.

7. The method of claim 6, wherein the second range of wavelengths are wavelengths of a far blue end of the solar spectrum.

8. The method of claim 1, wherein a second cell unit is formed from any of Gallium Arsenide (GaAs), Gallium Iridium Phosphide ($Ga_{1-x}In_xP$), Gallium Indium Arsenide ($Ga_{1-x}In_xAs$), Indium Phosphide (InP) and Gallium Indium Arsenide Phosphide ($Ga_{1-x}In_xAs_{1-y}P_y$), and Aluminum Gallium Iridium Phosphide (($Al_xGa_{1-x})_{1-y}In_yP$).

9. The method of claim 1, wherein the solar cell device comprises a plurality of cell units, wherein each cell unit is configured to absorb different wavelengths of the solar spectrum.

10. The method of claim 1, further comprising the step of:
    providing a substrate on which the cell is formed, wherein the substrate is formed of Gallium Arsenide (GaAs), Indium Phosphide (InP) or Germanium (Ge).

11. The method of claim 1, further comprising:
    removing the cell unit with the oxidized window layer from the furnace,
    providing the metal conductive material on the cap layer; and
    applying an antireflection coating to the oxidized window layer.

12. The method of claim 11, further comprising:
    providing a backside contact on a bottom surface of the substrate.

13. The solar cell device of claim 1, wherein the window layer has a thickness, comprising the step of oxidizing only a top portion of the window layer.

14. The solar cell device of claim 1, wherein the window layer has a thickness, comprising the step of oxidizing the entire thickness of the window layer.

15. The solar cell device of claim 1, wherein prior to oxidation the window layer has a first thickness, and after oxidation the window layer has a second thickness that is greater than the first thickness.

16. The method of claim 1, further comprising the steps of providing the metal conductive material on the cap layer prior to introducing the cell unit to the furnace,
    removing the cell unit with the oxidized window layer from the furnace, and then
    applying an antireflection coating to the oxidized window layer.

17. The method of claim 1, further comprising adjusting the temperature of the chamber based on the material composition of the window layer.

18. The method of claim 1, further comprising adjusting the time the unit cell is placed in the chamber based on the material composition of the window layer.

19. A method for fabricating a Group III-V compound semiconductor solar cell device, the method comprising the steps of:
 forming at least one cell unit from a Gallium Indium Phosphide ($Ga_{1-x}In_xP$) compound semiconductor material, the cell unit being configured to absorb predetermined wavelengths of a solar spectrum;
 forming an unoxidized window layer on the cell unit to prevent recombination of photo-generated carriers at a top surface of the solar cell device;
 providing a cap layer on the window layer to enhance an electrical contact with a metal conductive material;
 etching the cap layer to expose at least a portion of the window layer; and
 oxidizing the window layer to convert the window layer to an oxidized window layer, wherein the step of oxidizing includes the further steps of:
  once the cell unit is formed, subjecting the cell unit to a post-processing wet oxidation technique including placing the cell unit with the unoxidized window layer in a chamber of a furnace having a temperature in the range of 350° C. to 550° C. and a pressure of generally atmospheric pressure, and
  placing the cell unit in the chamber for a time in a range between about 1.0 hour and about 3.0 hours; and then
  oxidizing the exposed portion of the window layer using the wet oxidation technique after the device is formed, the exposed portion corresponding to an etched portion of the cap layer,
 wherein the oxidized window layer is an AlGaAs window layer, and
 wherein the oxidized window layer transmits a second range of wavelengths of the solar spectrum to the cell unit to increase a photoluminescence (PL) intensity of the cell unit, the second range of wavelengths being absorbed in the window layer.

20. The method of claim 19, wherein the oxidized window layer has a larger band gap than the window layer and wherein a band gap of the oxidized window layer is about 4.0 eV.

* * * * *